US005324986A

United States Patent [19]

Ueno et al.

[11] Patent Number: 5,324,986

[45] Date of Patent: Jun. 28, 1994

[54] CHIP TYPE VARISTOR

[75] Inventors: Yasushi Ueno; Akinori Nakayama; Kazutaka Nakamura; Yasunobu Yoneda; Yukio Sakabe; Tomoaki Ushiro, all of Nagaokakyo, Japan

[73] Assignee: Murata Manufacturing Co., Ltd., Japan

[21] Appl. No.: 901,750

[22] Filed: Jun. 22, 1992

[30] Foreign Application Priority Data

Jun. 27, 1991 [JP] Japan ................................ 3-183830

[51] Int. Cl.[5] .................... H01L 23/053; H01L 23/14; H01L 23/15

[52] U.S. Cl. .................................... 257/701; 257/702; 257/703

[58] Field of Search .................... 361/328; 338/20, 21; 257/701, 702, 703

[56] References Cited

U.S. PATENT DOCUMENTS 4,470,099 9/1984 Sawairi ................................ 361/328
5,119,062 6/1992 Nakamura et al. ................... 338/20

FOREIGN PATENT DOCUMENTS 0073609 3/1989 Japan ................................ 361/328
0237008 9/1990 Japan ................................ 361/328
3161901 7/1991 Japan ........................................ 7/10

*Primary Examiner*—William L. Sikes
*Assistant Examiner*—Fetsum Abraham
*Attorney, Agent, or Firm*—Ostrolenk, Faber, Gerb & Soffen

[57] ABSTRACT

A chip type varistor in which first and second inner electrodes are embedded in a sintered body obtained by laminating a plurality of semiconductor ceramics layers so as not to be overlapped with each other in the direction of thickness of the ceramics layers, respective one edges of the first and second inner electrodes are led out to one and the other of a pair of side surfaces opposed to each other of the sintered body and are electrically connected to outer electrodes formed on the pair of side surfaces of the sintered body, respectively, a non-connected type inner electrode which is not electrically connected to the above described outer electrodes is embedded in the sintered body, and the non-connected type inner electrode is arranged so as to be overlapped with the first and second inner electrodes while being separated by the semiconductor ceramics layer.

9 Claims, 3 Drawing Sheets

CHIP TYPE VARISTOR

BACKGROUND OF THE INVENTION

1. Field of the Invention

The present invention relates generally to a chip type varistor functioning as a voltage non-linear resistor, and more particularly, to a chip type varistor so constructed as to obtain varistor characteristics in the interface of an inner electrode and a semiconductor ceramics layer.

2. Description of the Prior Art

Recently in the field of electronic equipments such as a communication device, miniaturization and integration of electronic components have proceeded. Correspondingly, also in a varistor, the demands for miniaturization and a lower voltage have been increased. A monolithic type varistor as shown in FIG. 5 has been conventionally proposed as one meeting the demands (Japanese Patent Laid-Open Gazette No. 302496/1989).

In this monolithic type varistor 20, a pair of inner electrodes 22 and 23 are embedded in a sintered body 21 formed by laminating a lot of semiconductor ceramics layers. In addition, only respective one edges **22*a* and 23*a* of the inner electrodes 22 and 23 are led out to side surfaces 21*a* and 21*b* of the above described sintered body 21, and are connected to outer electrodes 24 and 25 formed on the side surfaces 21*a* and 21*b*. Non-connected type inner electrodes 27 which are not connected to the above described outer electrodes 24 and 25 are embedded in semiconductor ceramics layers 28 between the above described inner electrodes 22 and 23, and each of the non-connected type inner electrodes 27 is sealed in the sintered body 21**.

In this monolithic type varistor 20, varistor characteristics are obtained in each of the interfaces of the above described inner electrodes 22 and 23 and non-connected type inner electrodes 27 and the semiconductor ceramics layers 28. In addition, the number of grain boundaries in the direction of thickness of the ceramics layers 28 among the above described electrodes 22, 23 and 27 is set to not more than two, and a varistor voltage is controlled by selecting the number of ceramics layers 28 laminated.

Meanwhile, in the above described conventional monolithic type varistor, the inner electrodes or the non-connected type inner electrodes are formed on a plurality of ceramic green sheets and then, the plurality of ceramic green sheets are laminated and cofired, thereby to obtain the sintered body 21. Consequently, mesh-shaped holes are easily generated in the inner electrodes and the non-connected type inner electrodes after sintering by the shrinkage of a metal constituting the above described inner electrodes or the like and the evaporation of organic matter at the time of sintering. As a result, a semiconductor crystal grows in the direction of thickness in the sintered body through the holes, thereby to encounter the problems of causing the variation of a varistor voltage and increasing a leakage current. In addition, there also arises the problem of decreasing the surge current withstand because current concentrations are easily caused in the above described semiconductor crystal portion which has grown.

SUMMARY OF THE INVENTION

The present invention has been made so as to solve the above described problems of the prior art and has for its object to provide a chip type varistor capable of reducing the variation of a varistor voltage and a leakage current as well as increasing the surge current withstand.

As a result of examining the cause of generating the above described mesh-shaped holes in inner electrodes and non-connected type inner electrodes at the time of sintering, the inventors of the present application have considered that the above described holes are easily generated by, for example, the evaporation of organic matter because the respective electrodes are overlapped with each other in the direction of thickness of ceramics layers. Consequently, they have considered that such an arrangement is effective that the inner electrodes and the non-connected type inner electrodes are not overlapped with each other as little as possible in the direction of thickness of a sintered body, to make the present invention.

More specifically, the present invention provides a chip type varistor comprising a sintered body composed of semiconductor ceramics and having an upper surface, a lower surface and a plurality of side surfaces connecting the upper surface and the lower surface, first and second inner electrodes embedded in the above described sintered body so as not to be overlapped with each other in the direction of thickness of the sintered body and formed so as to be led out to the different side surfaces of the above described sintered body, a pair of outer electrodes electrically connected to the above described first and second inner electrodes, respectively, and formed on the side surfaces of the sintered body, and at least one non-connected type inner electrode embedded in the sintered body so as not to be electrically connected to the outer electrodes and formed so as to be overlapped with at least one of the above described first and second inner electrode while being separated by a semiconductor ceramics layer.

In the present invention, the number of non-connected type inner electrodes may be one or a plural. More specifically, one non-connected type inner electrode may be arranged so as to be overlapped with both the first and second inner electrodes while being separated by a ceramics layer. Alternatively, a plurality of non-connected type inner electrodes may be arranged so as to be respectively overlapped with the first and second inner electrodes. However, it is desired that three or more inner electrodes and non-connected type inner electrodes are not overlapped with each other in the direction of thickness of the sintered body. The reason for this is that the effect of restraining the generation of the above described mesh-shaped holes is lowered if a total of three or more inner electrodes and non-connected type inner electrodes are overlapped with each other in the direction of thickness while being separated by a ceramics layer.

In the chip type varistor according to the present invention, the first and second inner electrodes are arranged in the sintered body so as not to be overlapped with each other in the direction of thickness, and the above described non-connected type inner electrode is arranged so as to be overlapped with the first and second inner electrodes while being separated by the semiconductor ceramics layer, so that only the inner electrodes and the non-connected type inner electrode are overleaped with each other in the direction of thickness. Consequently, the number of electrodes overlapped with each other in the direction of thickness of the sintered body can be reduced, as compared with the conventional monolithic type varistor. Therefore, the generation of the above described mesh-shaped holes at the time of sintering can be restrained, thereby to make it possible to restrain the growth of a semiconductor crystal in the direction of thickness of the sintered body. As a result, the variation of a varistor voltage is reduced and an amount of a leakage current is reduced. In addition, current concentrations are avoided to increase the surge voltage withstand.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described with reference to the drawings.

Figure 1:
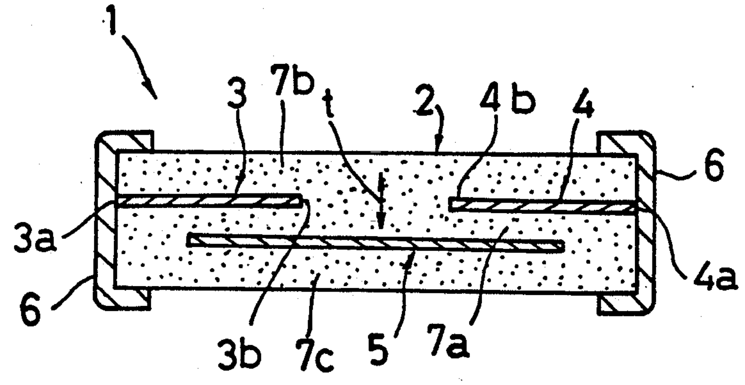
FIG. 1 is a cross sectional view for explaining a chip type varistor according to a first embodiment of the present invention.
Figure 2:
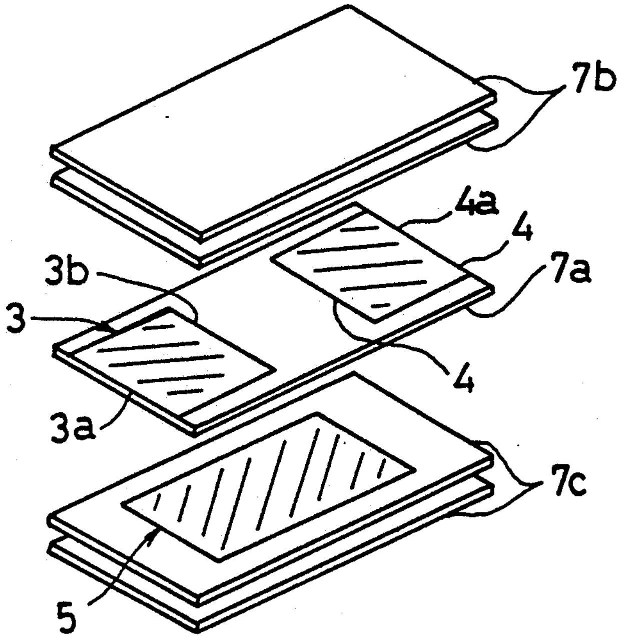
FIG. 2 is an exploded perspective view illustrating the chip type varistor according to the first embodiment.

FIGS. 1 and 2 are diagrams for explaining a chip type varistor according to a first embodiment of the present invention.

In FIGS. 1 and 2, reference numeral 1 denotes a chip type varistor according to the present embodiment. In the chip type varistor 1, a first inner electrode 3 and a second inner electrode 4 are embedded in a ceramics sintered body 2 in the form of a rectangular parallelopiped. In addition, a non-connected type inner electrode 5 is embedded in the sintered body 2, and outer electrodes 6 are formed on a pair of side surfaces 2a and 2b opposed to each other of the above described sintered body 2.

The above described sintered body 2 is formed by laminating a lot of green sheets 7a to 7c for constituting semiconductor ceramics layers, followed by cofiring. For easy understanding, the ceramic green sheets used and the semiconductor ceramics layers constituted by the green sheets are assigned the same reference numerals in the present specification. A portion interposed between the first or second inner electrode 3 or 4 and the non-connected type inner electrode 5 in the above described sintered body 2 is a ceramics layer 7a exhibiting voltage non-linearity. In addition, portions above and below the portion where the ceramics layer 7a is arranged are dummy ceramics layers 7b and 7c.

Furthermore, respective one edges 3a and 4a of the above described first and second inner electrodes 3 and 4 are respectively exposed to the side surfaces 2a and 2b of the above described sintered body 2 and are connected to one or the other of the above described outer electrodes 6. The respective remaining edges of the inner electrodes 3 and 4 are sealed in the above described sintered body 2. Further, respective edges of the above described non-connected type inner electrode 5 are located in the above described sintered body 2, so that the non-connected type inner electrode 5 is sealed in the sintered body 2 without being electrically connected to the outer electrodes 6.

The above described first and second inner electrodes 3 and 4 are so arranged that they are located in the same plane and are not overlapped with each other in the direction of thickness t of the above described ceramics layers 7a to 7c, and inner edges 3b and 4b of both the inner electrodes 3 and 4 are opposed to each other with spacing. In addition, the above described non-connected type inner electrode 5 is overlapped with the above described first and second inner electrodes 3 and 4 while being separated by the ceramics layer 7a. A portion where the non-connected type inner electrode 5 and the first or second inner electrode 3 or 4 are opposed to each other is a varistor characteristic portion.

Description is now made of a method of fabricating the chip type varistor 1 according to the present embodiment.

First, 0.1% by weight of a glass powder composed of $B_2O_3$, $SiO_2$, PbO and ZnO is weighted and mixed with a ceramics material containing ZnO (96.0 mol %) as its main component and containing $CoCO_3$ (1.0 mol %), $MnCO_3$ (0.5 mol %), $Sb_2O_3$ (2.0 mol %) and $Bi_2O_3$ (0.5 mol mixed at the above described molar ratio with ZnO, to prepare a raw material. In addition, an organic binder is mixed with the raw material, to form a ceramic green sheet having a thickness of 10 μm in the reverse roller method. This green sheet is cut to a rectangular shape, to form a lot of ceramic green sheets 7a to 7c.

An organic vehicle is then mixed with a metal powder composed of Pt, to prepare an electrode paste. The above described paste is printed on the upper surface of the above described ceramic green sheet 7a to form first and second inner electrodes 3 and 4, as shown in FIG. 2. In this case, the first and second inner electrodes 3 and 4 are so formed that only respective one edges 3a and 4a of the inner electrodes 3 and 4 are located in right and left edges of the ceramic green sheet 7a, and the remaining edges are located in the ceramic green sheet 7a. In addition, the above described paste is printed on the upper surface of one dummy ceramics layer 7c, to form a non-connected type inner electrode 5. In this case, the non-connected type inner electrode 5 is so formed that all edges thereof are located in the inside of the periphery of the ceramic green sheet 7c.

As shown in FIG. 2, the ceramic green sheet 7c having the non-connected type inner electrode 5 formed therein is then superimposed on the lower surface of the above described ceramic green sheet 7a having the inner electrodes 3 and 4 formed therein, and ten dummy ceramic green sheets 7b and 7c are further respectively superimposed on the upper and lower parts thereof, to obtain a laminated body. The laminated body is pressed by applying a pressure of 2 $t/cm^2$ in the direction of thickness of the laminated body and then, the laminated body is cut to a predetermined size.

The above described laminated body cut is then sintered at temperatures of 1050° C. to 1150° C. for three hours in the air, to obtain a sintered body 2. In the case of the sintering, the number of electrodes overlapped with each other in the direction of thickness t of the sintered body 2 is two, so that organic matter easily evaporates. Consequently, the number of holes generated in the interface is reduced.

Finally, an electrode paste containing Ag and Pd mixed at a weight ratio of 7 to 3 is applied to a pair of side surfaces 2*a* and 2*b* of the above described sintered body 2 to which the respective one edges 3*a* and 4*a* of the inner electrodes 3 and 4 are exposed and then, is baked, to form outer electrodes 6. Consequently, the chip type varistor 1 according to the present embodiment is fabricated.

According to the present embodiment, therefore, the first and second inner electrodes 3 and 4 are arranged on the same plane so as not to be overlapped with each other in the direction of thickness t, and the non-connected type inner electrode 5 is disposed so as to be overlapped with each of the above described inner electrodes 3 and 4 while being separated by the semiconductor ceramics layer 7*a*. Accordingly, the number of electrodes overlapped with each other in the direction of thickness t is two. Consequently, the number of times of occurrence of the mesh-shaped hole at the time of sintering can be reduced. As a result, the growth of a semiconductor crystal can be restrained to reduce the variation of a varistor voltage as well as reduce a leakage current. In addition, current concentrations can be avoided to increase the surge current withstand.

Figure 3:
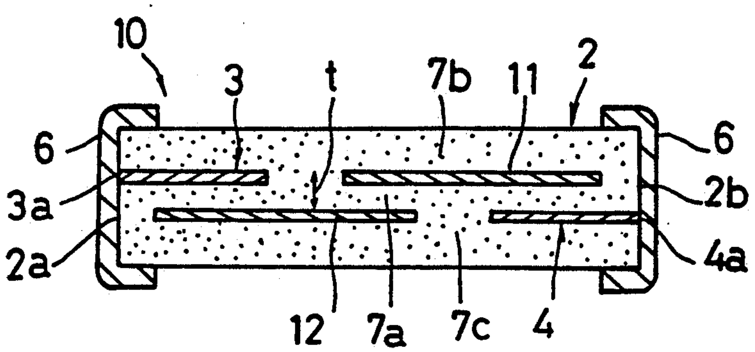
FIG. 3 is a cross sectional view for explaining a chip type varistor according to a second embodiment.
Figure 4:
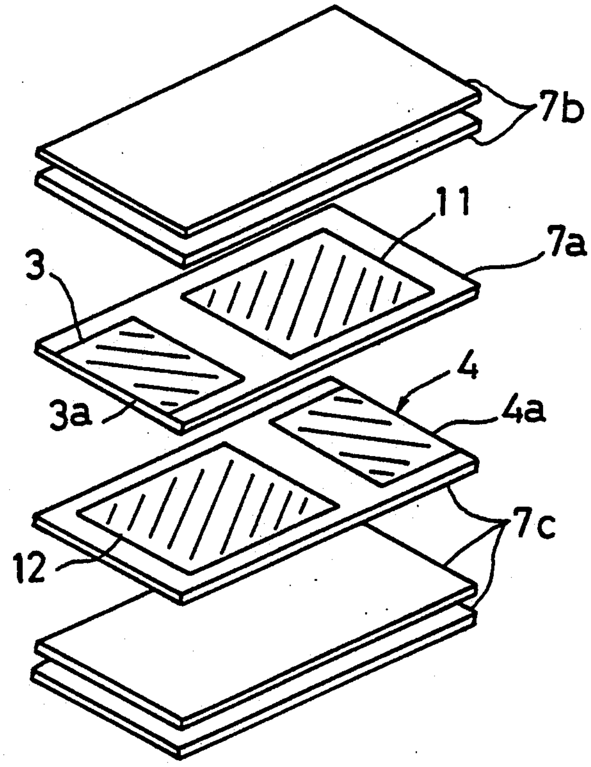
FIG. 4 is an exploded perspective view illustrating the chip type varistor according to the second embodiment.

FIGS. 3 and 4 are diagrams for explaining a chip type varistor according to a second embodiment of the present invention. In FIGS. 3 and 4, the same reference numerals as those used in FIG. 1 designate the same or corresponding portions.

In a chip type varistor 10 according to the present embodiment, first and second inner electrodes 3 and 4 are embedded in a sintered body 2 so as not to be overlapped with each other in the direction of thickness t of a ceramics layer 7*a* and in positions at different heights. In addition, a non-connected type inner electrode 11 which is not connected to outer electrodes 6 is formed in the same plane as the above described first inner electrode 3, and a non-connected type inner electrode 12 is formed in the same plane as the above described second inner electrode 4. The non-connected type inner electrode 12 is overlapped with the above described first inner electrode 3 while being separated by the ceramics layer 7*a*, and the non-connected type inner electrode 11 is overlapped with the second inner electrode 4 while being separated by the ceramics layer 7*a*.

Also in the present embodiment, the number of electrodes overlapped with each other in the direction of thickness t is two. Accordingly, the variation of a varistor voltage can be reduced and a leakage current can be reduced, to obtain the same effect as that in the above described first embodiment.

TABLE 1

| | $V_{1mA}$ (V) | $\alpha_{1\text{-}10mA}$ | Cap (pF) | IR (MΩ) | Surge Current Withstand |
|---|---|---|---|---|---|
| Sample in First Embodiment | 7.48 | 38 | 732 | 3.8 (Application of 4 V) | 50 A |
| Conventional Sample (8 V) | 7.96 | 28 | 833 | 0.9 (Application of 4 V) | 30 A |
| Sample in Second Embodiment | 11.5 | 33 | 518 | 5.7 (Application of 6 V) | 50 A |
| Conventional Sample (12 V) | 11.8 | 25 | 618 | 1.2 (Application of 6 V) | 20 A |

Figure 5:
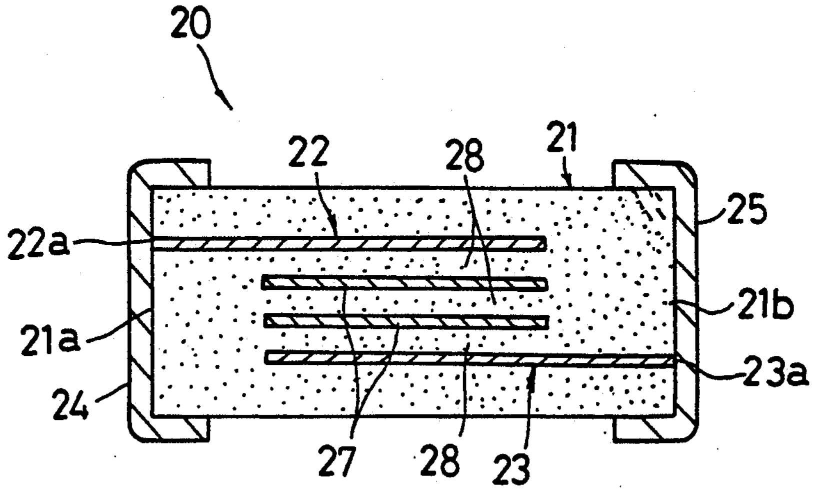
FIG. 5 PRIOR ART
FIG. 5 is a cross sectional view illustrating a conventional monolithic type varistor.

Table 1 shows the results of a test carried out so as to confirm the effects of the above described chip type varistors 1 and 10 according to the first and second embodiments. This test is carried out by preparing a sample according to the first embodiment and a sample according to the second embodiment in the above described fabricating method, and measuring a varistor voltage $V_{1mA}$, a voltage non-linearity index $\alpha$, capacitance (pF), resistance (MΩ) in a case where a DC voltage of 4 or 6 volts as shown in Table 1 is applied for thirty seconds, and surge current withstand (A) in a case where a triangular current wave having a waveform of 8×20 microseconds is applied with respect to each of the samples. For comparison, the same measurements are made with respect to the conventional monolithic type varistor (see FIG. 5).

As can be seen from Table 1, approximately the same value of the varistor voltage is obtained in any of the samples in the embodiments and the conventional examples. On the other hand, in the sample according to each of the embodiments, the capacitance can be reduced by approximately 100 PF, and the voltage non-linearity index is improved by approximately 10, as compared with the sample in each of the conventional examples. In addition, the resistance is low, for example, 0.9 or 1.2 MΩ in the sample in each of the conventional examples, so that a leakage current is large. On the other hand, the resistance is high, i.e., 3.8 or 5.7 MΩ in the sample according to each of the embodiments, so that a leakage current can be reduced. Further, the serge current withstand is 20 or 30 A in the sample in each of the conventional examples, while being improved, i.e., 50 A in the sample according to each of the embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chip type varistor comprising:

a sintered body composed of semiconductor ceramics and having an upper surface, a lower surface and a plurality of side surfaces connecting the upper surface and the lower surface;

first and second inner electrodes embedded in said sintered body so as not to be overlapped with each other in the direction of thickness of the sintered body and formed so as to be led out to the different side surfaces of said sintered body;

a pair of outer electrodes formed on the side surfaces of the sintered body so as to be electrically connected to said first and second inner electrodes, respectively; and at least one non-connected type inner electrode embedded in the sintered body so as not to be electrically connected to said outer electrodes and formed so as to be overlapped with said first and second inner electrodes while being separated by a semiconductor ceramics layer.

2. The chip type varistor according to claim 1, wherein a plurality of non-connected type inner electrodes are embedded.

3. The chip type varistor according to claim 1, wherein said first and second inner electrodes are formed on the same plane in the sintered body.

4. The chip type varistor according to claim 3, wherein one non-connected type inner electrode is formed and is embedded so as to be overlapped with both said first and second inner electrodes while being separated by the semiconductor ceramics layer.

5. The chip type varistor according to claim 3, wherein said first and second inner electrodes are respectively led out to a pair of side surfaces opposed to each other of the sintered body, respectively.

6. The chip type varistor according to claim 1, wherein said first and second inner electrodes are formed on different planes in said sintered body.

7. The chip type varistor according to claim 6, wherein two non-connected type inner electrodes are embedded, one of the non-connected type inner electrodes being arranged so as to be partially overlapped with said first inner electrode while being separated by the ceramics layer, and the other non-connected type inner electrode being arranged so as to be partially overlapped with both said one non-connected type inner electrode and said second inner electrode while being separated by the ceramics layer.

8. The chip type varistor according to claim 7, wherein said first inner electrode and said other non-connected type inner electrode are formed on a plane in a position at a certain height, and said second inner electrode and said one non-connected type inner electrode are formed on a plane in a position at the other height.

9. The chip type varistor according to claim 6, wherein said first and second inner electrodes are respectively led out to a pair of side surfaces opposed to each other of the sintered body.

* * * * *